United States Patent [19]

Livsey

[11] Patent Number: 4,567,429
[45] Date of Patent: Jan. 28, 1986

[54] DIGITAL SERVO INDICATOR

[75] Inventor: Robert A. Livsey, Richmond Hts., Ohio

[73] Assignee: Quest Corporation, Macedonia, Ohio

[21] Appl. No.: 344,940

[22] Filed: Feb. 2, 1982

[51] Int. Cl.[4] .......................................... G01R 17/06
[52] U.S. Cl. .................................. 324/99 D; 324/130
[58] Field of Search .................... 324/99 D, 120, 130;
340/347 AD

[56] References Cited

U.S. PATENT DOCUMENTS

| | | | |
|---|---|---|---|
| 2,880,392 | 3/1959 | Paulsen | 324/99 D |
| 3,201,781 | 8/1965 | Holland | 324/120 |
| 3,473,122 | 10/1969 | Holt | 324/120 |
| 3,577,075 | 5/1971 | Krygeris | 324/99 D |

Primary Examiner—Ernest F. Karlsen
Attorney, Agent, or Firm—Pearne, Gordon, Sessions, McCoy, Granger & Tilberry

[57] ABSTRACT

An improved digital servo indicator of the continuous null-balance potentiometric type is disclosed which includes a microcomputer to provide a digital readout of the measured results in the desired engineering unit, or to use the readout in further calculations as desired. The indicator includes a digital-to-analog conversion means using a cascading series of circuits each having a precision resistance element and a pair of MOSFETs for selectively connecting a constant reference voltage to the output through the resistance element to produce the desired analog output.

8 Claims, 3 Drawing Figures

DIGITAL SERVO INDICATOR

BACKGROUND OF THE INVENTION

1. Field of the Invention

This invention relates generally to servo indicators and, more particularly, to digital servo indicators using the continuous null-balance potentiometric principle to measure and balance unknown signals in the submicrovolt range and produce a digital readout in the desired engineering unit.

2. Description of the Prior Art

Prior art servo indicators have used the null-balance potentiometric principle to balance unknown voltages and to provide a digital readout in the desired engineering values or units. In some of these prior art devices, the balance was approached linearly at a single rate, in which instance the damping was often ineffective and the null or balance point was frequently overshot, with the result that balance must then be approached from the other direction, also at a single rate of correction, until, like a pendulum coming to rest, the null point was reached.

Some prior art devices have attempted to overcome the problem of overshooting by incorporating two linear rates of correction—a faster rate when the error signal was large, and a slower, but likewise linear, rate of correction when the error signal was at or less than a predetermined limit.

In U.S. Pat. No. 3,577,075, issued to Krygeris, an indicator was disclosed which had a narrow bandwidth at or near the balance which prevented overshooting of the balance position and which controlled and provided a rate of error correction which was a function of the magnitude of the error signal, so that the approach to the balance was at a progressively slower rate, essentially asymptotic to the balance, and the balance was therefore approached rapidly when the error signal was large but slowly when the error signal was small. This indicator represented a significant improvement over the prior art. However, the Krygeris indicator had several shortcomings. Two digital-to-analog converters were used, each of the Kelvin-Varley type. In addition, the BCD output had limited utility and was not able to provide the versitility of modern microcomputers.

SUMMARY OF THE INVENTION

The present invention provides a new and improved digital servo indicator of the null-balance potentiometric type which overcomes the disadvantages and shortcomings of the prior art indicators and provides improvements over the Krygeris indicator disclosed in U.S. Pat. No. 3,577,075.

The digital servo indicator of the present invention includes a microcomputer which controls the digital-to-analog converter and is capable of more sophisticated computations to provide readouts in multiple units and to apply mathematical formulae to the measurements to produce more sophisticated readouts. The indicator of the present invention also uses a solid-state digital-to-analog converter which provides greater reliability. The digital-to-analog (d/a) converter is preferably of the type having a cascading series of circuits separated by different value resistors and having switches to selectively operate the circuits to produce the desired analog output. The accuracy and precision of the d/a converter of the present invention are increased by utilizing MOSFETs as switching elements, and are further increased by providing a positive feedback circuit for each resistor.

These and other advantages are achieved by the present invention of the digital servo indicator for producing an indication representing the measurement of an unknown voltage. The indicator of the present invention comprises a digital-to-analog conversion means for producing a variable known voltage, and means connecting the known voltage in opposition to the unknown voltage to produce an error signal from the difference therebetween. The indicator also comprises a voltage-to-frequency conversion means for producing a series of pulses from the error signal. The series of pulses has a repetition rate which is proportional to the magnitude of the error signal. A bidirectional counter counts the pulses and provides a binary signal in response thereto. The indicator also comprises means responsive to the polarity of the error signal for enabling the counter to be incremented by the pulses for one polarity and decremented by the pulses for the opposite polarity. Microcomputer means are connected to the digital-to-analog conversion means for receiving the binary signal from the counter and for converting the binary signal to data representing the measurement of the unknown voltage. The microcomputer also provides a signal for a digital readout, and may include internal programming to perform mathematical operations on the readout to produce a desired output.

The digital-to-analog conversion means preferably includes means for producing a variable known voltage from a constant reference voltage using a cascading series of circuits. Each circuit has a precision resistance element and a pair of MOSFETs for selectively connecting the constant reference voltage to the output through the resistance element to produce the desired known voltage. In addition, each circuit in the digital-to-analog conversion means may also have a positive feedback means connected thereto to reduce the equivalent resistance of the MOSFETs.

DESCRIPTION OF THE PREFERRED EMBODIMENTS

Figure 1:
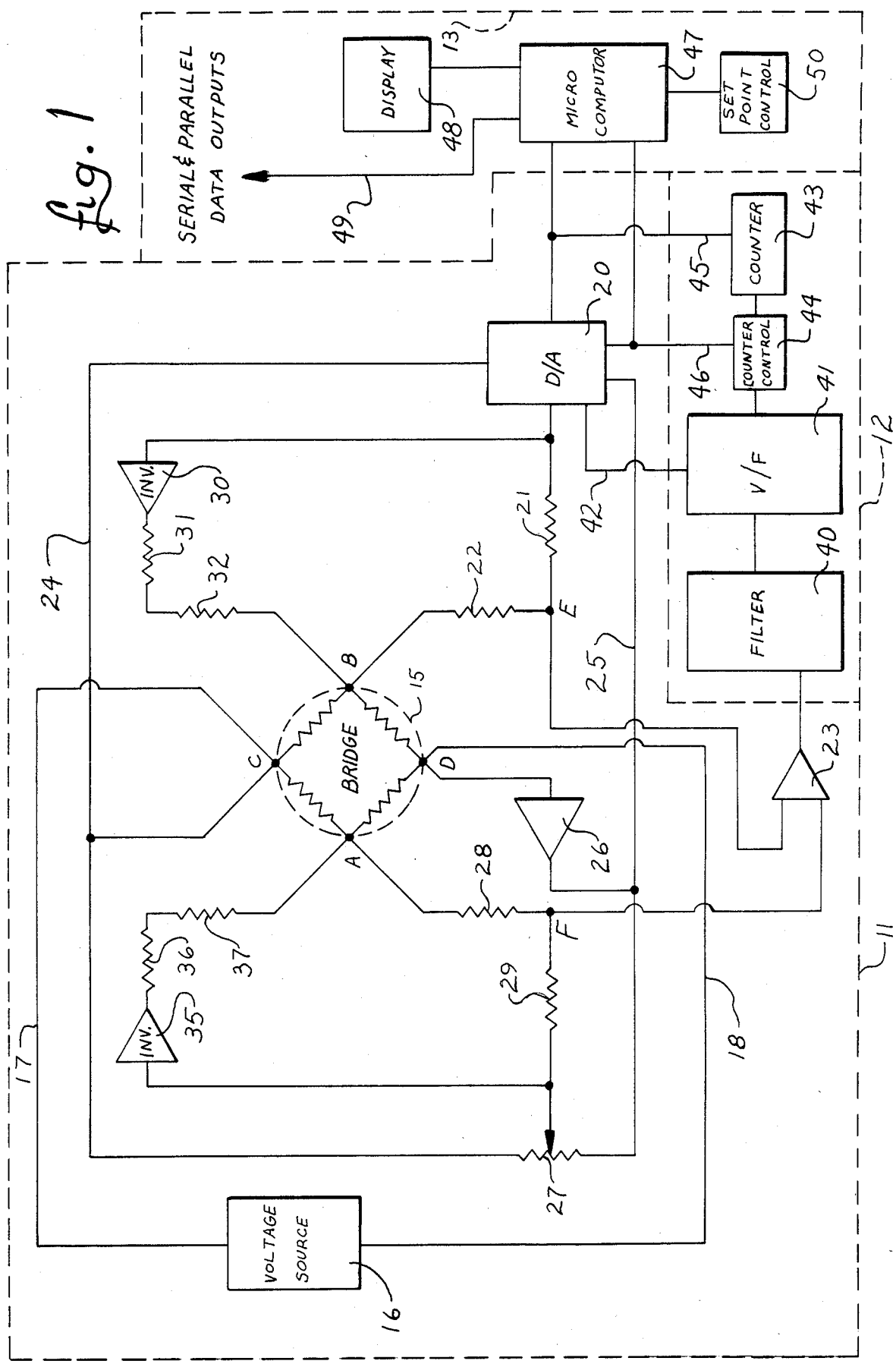
FIG. 1 is a block diagram of a servo indicator embodying the preferred form of the present invention.

Referring more particularly to the drawings, and initially to FIG. 1, a servo indicator 10 is shown which includes a measuring circuit 11, a response and correction circuit 12, and a control circuit 13. The measuring circuit 11 receives an unknown voltage from a source, which may be, for example, a bridge 15. The bridge is normally external of the servo indicator, and has as one arm a transducer which conventionally exhibits variable resistance in response to the changing value of a given parameter, such as temperature, pressure, or the like, which the indicator is to measure.

The measuring circuit 11 includes means to sense the unknown voltage produced by the imbalance of the bridge 15. The unknown input voltage from the bridge 15 is connected at points A and B, while a supply voltage produced by a voltage source 16 is connected to points C and D by means of leads 17 and 18. The response and correction circuit 12, as hereinafter described, responds to the imbalance between the ratios of the voltages DB to BC and DA to AC to cause a feedback or opposition voltage to offset the balance. This feedback or opposition voltage is produced by a digital-to-analog (d/a) converter 20, and is coupled through a resistor 21. The unknown voltage from the point B of the bridge 15 is coupled through a resistor 22. The feedback voltage from the d/a converter 20 is combined with the unknown voltage from the point B at a point E. The resulting error or imbalance signal as determined by the difference between the unknown voltage and the feedback voltage appears at the point E, and is connected to one input of a differential amplifier 23 of the well-known chopper type.

Reference voltage is supplied to the d/a converter 20 via leads 24 and 25. The lead 24 is connected directly to the voltage source 16 through the point C by means of the lead 17. The lead 25 is connected to the output of a buffer amplifier 26 having its input connected to the other side of the voltage source 16 through the point D by means of the lead 18. The buffer amplifier 26 minimizes the sensitivity of the d/a converter 20 and the other circuit elements to changes in the output of the voltage source 16 and to errors caused by the voltage drop through the wires from the voltage source.

The measuring circuit 11 also includes means for zeroing the circuit for a no-load condition. The zeroing means comprises a rheostat 27 connected between the leads 24 and 25. The opposite side of the unknown voltage point A is coupled through a resistor 28 to a point F, which is connected to the remaining input of the differential amplifier 23. The wiper of the rheostat 27 is coupled through a resistor 29 to the point F. When the bridge 15 is balanced, the rheostat 25 may be varied so that the voltage appearing at the point F is equal to the voltage at the point E. The amplifier 23 is thus set to zero output when the bridge is balanced.

To ensure that there is no measuring circuit current flow into or out of the point B to affect the balance of the bridge, a balancing circuit is provided comprising an inverter amplifier 30 and resistors 31 and 32, which balance the load or impedance presented to the point B by the non-inverted output of the digital-to-analog converter 20 and the resistors 21 and 22. In order to provide that the impedance looking into the point A will be equal to that looking into the point B, another balancing circuit comprising an inverter amplifier 35 and resistors 36 and 37 is connected to the point A. The input of the inverter amplifier 35 is connected to the wiper of the rheostat 25, and the output of the inverter amplifier 35 is fed through the resistors 36 and 37 to the point A. The values of the resistors 36 and 37 are chosen to balance the resistors 28 and 29. The inverter amplifiers 30 and 35 are set so that the measuring circuit 11 is symmetrical in all respects, and no measuring circuit current or impedance will affect the bridge 15.

With the circuits so matched, any measuring circuit current flowing into the point B through the resistor 22 is matched by an equal and opposite current flowing through the resistor 32, so that there is no net measuring circuit current flow into or out of the point B. The inverter amplifier 30 produces a balance signal equal in magnitude to the feedback signal from the d/a converter 20 but of opposite polarity. Likewise, the inverter amplifier 35 and the resistors 36 and 37 ensure that there is no net measuring circuit current flow into or out of the point A to affect the bridge 15. The inverter amplifier 35 provides a balance signal equal in magnitude to that from the wiper of the rheostat 25, but of opposite polarity.

The d/a converter 20 is adapted to receive a control signal from the response and correction circuit 12 to produce a feedback voltage to oppose the unknown voltage and offset the imbalance of the bridge 15. The response and correction circuit 12 includes means whereby the circuit varies the rate of corrections which balance the measured error in proportion to the magnitude of the error. The magnitude of the feedback or opposition voltage when the measuring circuit is in balance is equal to the magnitude of the unknown voltage and is, therefore, a measure of the parameter being determined.

The imbalance between the voltages at the points E and F is sensed and amplified by the differential amplifier 23. In the amplifier 23 a double chopper converts the DC voltage difference to a square wave AC signal, which is in turn amplified and then demodulated or returned to a DC signal. The output of the differential amplifier 23 is then entered into a filter 40. The output of the filter 40, which is the amplifier imbalanced voltage, is converted within a voltage-to-frequency (v/f) converter 41 into a pulse train. The repetition rate of the pulse train is directly proportional to the magnitude of the voltage input to the v/f converter 41. The v/f converter 41 is a bipolar unit which causes the feedback voltage to increase or decrease as required for either polarity of error signal. A static stability enhancement feedback is provided through a lead 42 from the v/f converter 41 to the d/a converter 20. The voltage from the v/f converter 41 is summed with the output from the d/a converter 20 to minimize hunting when the input signal from the bridge 15 is stationary.

The filter 40 provides a narrow bandwidth, with the result that, in view of the constantly changing speed with which the balance is approached, there is no overshooting of the balance point and noise and stray signals are eliminated. The use of the narrow bandwidth filter 40 is permitted without sacrificing accuracy or speed of measurement by the use of the v/f converter 41 to control the rate of the imbalance correction.

The output of the v/f converter 41 goes to an up-down counter 43 and an up-down control 44. The counter 43 is responsive to the pulses from the v/f converter 41, and is incremented or decremented thereby. The counter control 44 controls the direction of the counting of the counter 43 according to the polarity of the imbalance signal received by the v/f converter 41. The signal received by the counter 43 from the converter 41 controls the rate and amount of counting, and thereby the rate and amount of correction of the imbalance. The signal received by the control 44 from the v/f converter 41 controls the direction of the counting of the counter 43, since the control 44 detects the polarity of the imbalance voltage.

Since the repetition rate of the pulses from the v/f converter 41 is proportional to the magnitude of the measuring circuit imbalance, the correction is faster for a large imbalance and slows in proportion to the nearness to the null-balance point. The output of the up-down counter 43, which is a digital signal, is fed by means of a lead 45 to the d/a converter 20 where it controls the d/a converter to cause it to add to or subtract from the feedback voltage produced by the converter. The output of the counter control 44 is fed by means of a lead 46 to the d/a converter 20 where it controls whether the d/a converters add to or subtract from the feedback voltage.

The response and correction circuit 12 thus includes means whereby the circuit varies the rate of correction which balances the measured error in proportion to the magnitude of the error. Thus, the rate of correction, which is always proportional to the error, is greater or faster when the error is large and less or slower when the error is small, with the result that the balance is approached asymptotically on an exponential curve, thereby preventing overshooting. Because of this feature, the correction signals near the balance are of relatively low frequency, thereby reducing noise and transient signals at and near the balance, whereby resolutions on the order of 0.01 microvolt are obtained.

Whereas the counter in the aforementioned U.S. Pat. No. 3,577,075 produces a binary coded decimal (BCD) signal, the counter 43 of the present invention produces a straight binary signal, and the output therefrom not only controls the d/a converter 20 to control the feedback or opposition voltage, but also is supplied to a microcomputer 47 by means of the lead 45. The microcomputer 47 receives the straight binary signal from the counter 43 and converts this binary signal to a value representing the measured parameter. This value may be supplied to a digital display 48, or via a lead 49 to other accessory devices in a manner well known in the art. Such devices may be, for example, printers, CRT terminals, scoreboards, or other computers. The microcomputer 47 may also contain internal programming to perform various operations. For example, the microcomputer 47 can convert the binary signal from the counter 43 or other internal binary information to BCD form or some other format for output to the display 48 or to other devices via the lead 49. The microcomputer 47 can also convert the output from English units to SI units, and vice versa. The microcomputer 47 can multiply internal numbers by the proper factor for computation of a new parameter in appropriate units. The multiplication factor may be a constant or may be calculated from other internal values. The microcomputer 47 can also compare the measured parameter value with range limits and can produce an appropriate out-of-range signal or alarm, such as, when a measured temperature or pressure exceeds specified safety limits.

The microcomputer 47 can be used to perform a zeroing function independent of the rheostat 27 by subtracting a certain measured amount, such as empty container weight, ambient pressure, or ambient temperature. This zeroing function may also include automatic zero tracking which corrects for zero drift by assuming that any stable reading near zero should be equal to zero. The microcomputer determines when a stable reading is sufficiently near zero, stores the value of this reading in memory, and subtracts this value from subequent readings. Automatic zero tracking corrects for transducer drift as well as instrument drift, and is particularly valuable in weight measurement to account for changes in measured weight of the empty container.

The microcomputer 47 can also be used to calculate various quantities or factors from the measured reading. In weight measurements, this capability may be used to calculate the number of pieces being weighed based on the known weight of each piece. This capability may also be used to derive densities, weight per length, mechanical power, or flow rates.

An additional input/output port for the microcomputer 47 is provided by a set point control 50. The control 50 may be operated as an input to manually enter instructions or data into the microcomputer 47. In return, the microcomputer 47 outputs to the control 50 a set of logic levels resulting from computations or comparisons performed by the microcomputer from the instructions or data supplied by the control 50 and from the signals supplied by the counter 43 and the counter control 44. For example, the set point control 50 may be used to input one or more manually entered set points which the microcomputer 47 may compare with a value calculated from the measured value to determine whether the value is greater or less than the measured value. The results of the comparison may then be output to the control 50, and may be used by the operator, for example, to halt the flow of material into a container when the desired weight has been reached. The set point control 50 may also be used to manually enter other system parameters, such as the empty weight of the container, tare weight, density, container volume, or thermal expansion coefficients.

Figure 2:
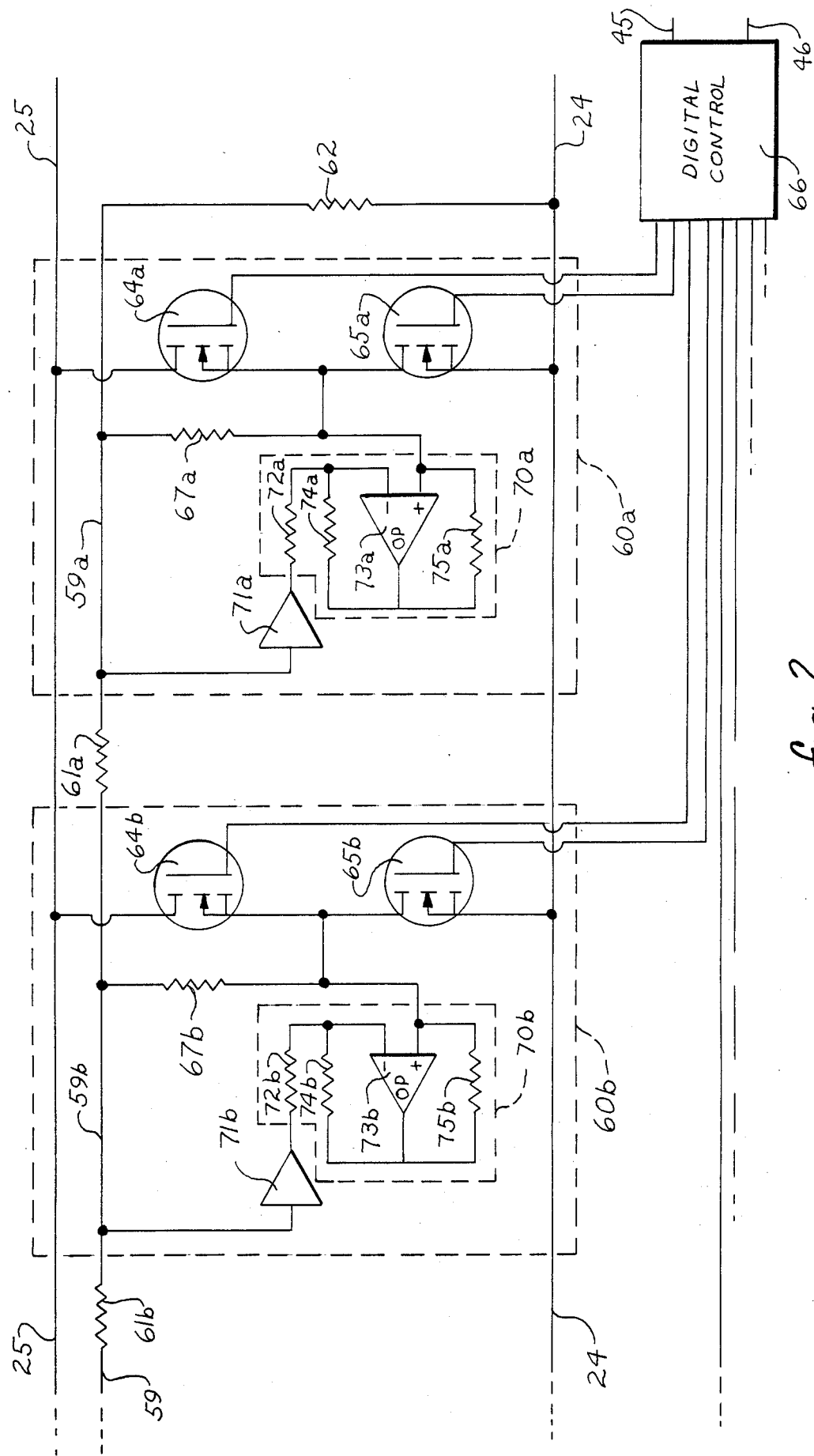
FIG. 2 is a block diagram of the digital-to-analog converter used in the servo indicator of FIG. 1.

The preferred form of digital-to-analog converter used as the converter 20 is shown in greater detail in FIG. 2. The d/a converter 20 uses a reference voltage supplied between the lead 25 and the lead 24. The desired analog output is produced between a lead 59 and the lead 24. The lead 24 is thus common both with respect to the lead 25 producing the reference voltage and with respect to the lead 59 producing the output voltage. The output voltage is produced by selectively connecting the lead 59 to the reference voltage lead 25 through a cascading series of circuits 60a, 60b, etc. Each circuit 60a, 60b, etc. is connected in series on the lead 59 and is separated by a resistor 61a, 61b, etc. The resistors 61a, 61b, etc. are used to weight the equivalent output resistance on the lead 59 to couple the circuits 60a, 60b, etc. together. In this manner, the resistor values are chosen to allow indefinite cascading of circuits. The resistors 61a, 61b, etc. divide the lead 59 into lead segments 59a, 59b, etc. The end of the last lead segment 59a is connected to the common lead 24 through a resistor 62.

Each circuit 60a, 60b, etc. is identical and all will be described with reference to the circuit 60a. The circuit 60a contains two power MOSFETs 64a and 65a, which are switched on and off by a digital control unit 66. The power MOSFET 64a has the drain connected to the reference voltage lead 25 and the source connected to the lead segment 59a through the resistor 67a. The power MOSFET 65a has the drain connected to the lead segment 59a through the resistor 67a, and has the source connected to the common lead 24. One, and only one, MOSFET of the pair 64a and 65a is always on, and the other of the pair is always off. The power MOSFETs 64a and 65a control the connection of the lead segment 59a through a precision resistance element 67a to either the reference voltage lead 25 or the common lead 24. Since one and only one MOSFET is always on, the lead segment 59a is connected through the resistor 67a to either the reference voltage lead 25 or the common lead 24 at all times.

The circuit 60b performs similarly with the MOSFETs 64b and 65b, controlling the connection of the lead segment 59b through the precision resistance element 67b to either the reference voltage lead 25 or the common lead 24. The cascading series of circuits 60a, 60b, etc. are controlled by the digital control 66 to produce the desired voltage output on the lead 59. The resistors 67a, 67b, etc. are selected so that each circuit 60a, 60b, etc. may be connected in series on the lead 59 to produce the desired voltage output.

The digital control 66 is connected to the counter 43 by means of the lead 45 and to the counter control 44 by means of the lead 46. The binary counter signals control the switching of the MOSFETs to produce the desired analog voltage. The control 66 is also connected to the microcomputer 47 by the leads 45 and 46, and the microcomputer can be programmed to preset both significant circuits of the d/a converter to shorten the time required to reach a balance condition.

Power MOSFETs 64a, 65a, 64b, 65b. etc. are used because the voltage drop through the MOSFETs is relatively small compared to other solid-state switching devices. The equivalent resistance of the switching element must be minimized as much as possible to prevent affecting the resistance of the precision resistance elements 67a, 67b, etc. To further reduce the equivalent resistance of the MOSFETs, a positive feedback circuit 70a, 70b, etc. is provided within each circuit 60a, 60b, etc. in parallel with the precision resistance element 67a, 67b, etc. Each feedback circuit 70a, 70b, etc. is identical, and all will be described with reference to the feedback circuit 70a. The feedback circuit 70a is connected in parallel with the precision resistance element 67a. The feedback circuit 70a includes an amplifier 71a which is connected to the lead segment 59a. The output of the amplifier 71a is fed through a resistor 72a to provide one of the inputs to an operational amplifier 73a. The output of the operational amplifier 73a has an external feedback through a resistor 74a to the same input. The output of the operational amplifier 73a is also supplied through a resistor 75a to the point between the power MOSFETs 64a and 65a. The voltage at this point is also fed back into the operational amplifier 73a to provide the other amplifier input.

If desired, additonal precision resistance elements may be included within each circuit and additional power MOSFETs may be used to control the connections to these resistance elements so that fewer resistance elements of varying values are used. An example of such a d/a converter is shown in FIG. 3.

Figure 3:
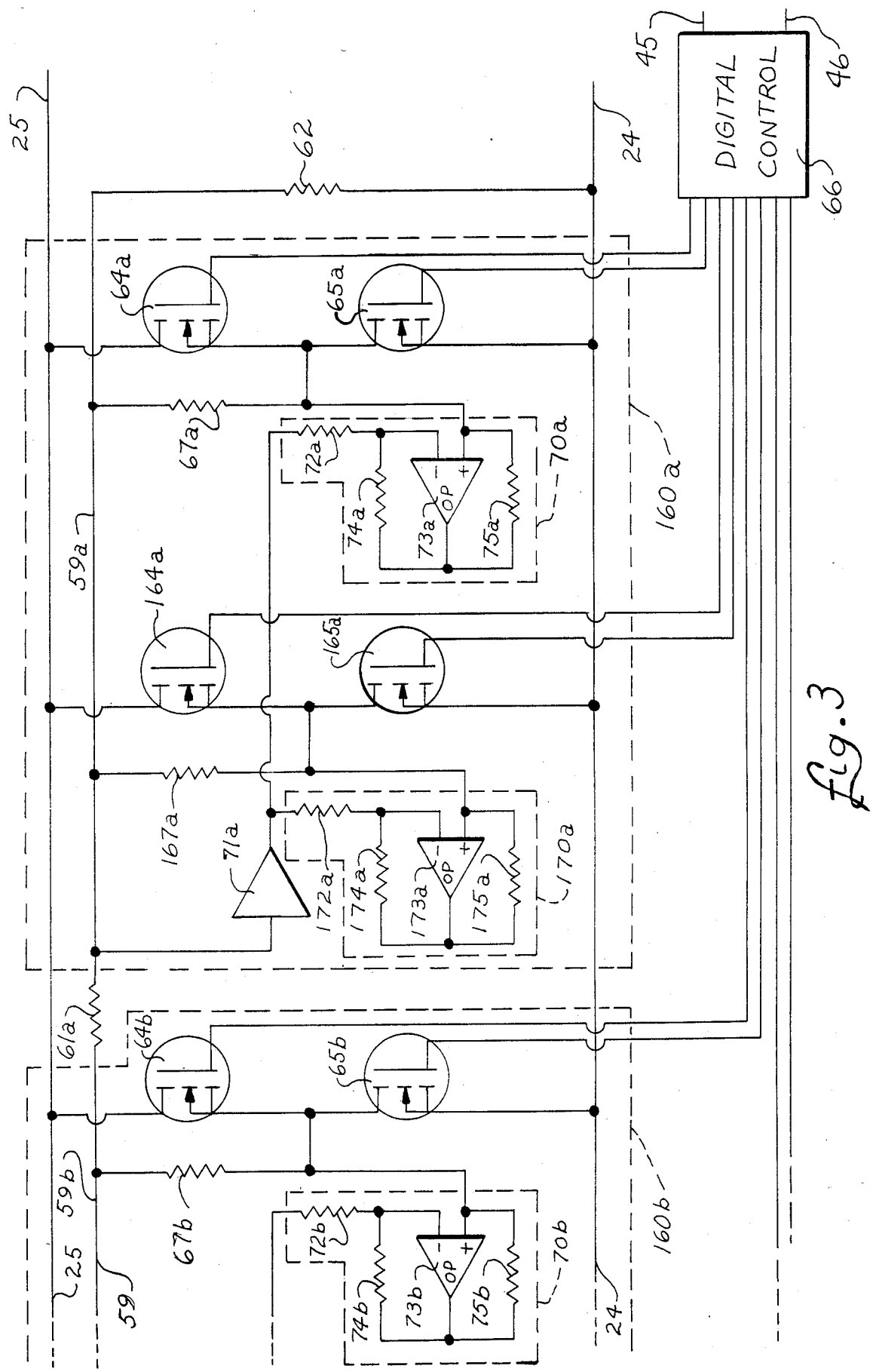
FIG. 3 is a block diagram similar to FIG. 2, showing an alternative digital-to-analog converter used in the indicator of FIG. 1.

The converter in FIG. 3 comprises a plurality of circuits 160a, 160b, etc. connected in series on the lead 59 and separated by resistors 61a, etc. as before. Each circuit 160a, 160b, etc. is identical, and all will be described with reference to the circuit 160a. The circuit 160a contains two power MOSFETs 64a and 65a, which are used to selectively connect the lead segment 59a through the precision resistance element 67a to either the reference voltage lead 25 or the common lead 24. A positive feedback circuit 70a comprising operational amplifier 73a and resistors 72a, 74a, and 75a is provided as before.

The circuit 160a also comprises two additional power MOSFETs 164a and 165a to selectively connect the lead segment 59a through another precision resistance element 167a to either the reference voltage lead 25 or the common lead 24. Another positive feedback circuit 170a is provided to reduce the equivalent resistance of the MOSFETs 164a and 165a. The feedback circuit 170a is identical to the circuit 70a, and both circuits may be served by the same amplifier 71a.

Modifications and changes to the preferred forms of the invention disclosed herein may be made by those skilled in the art to come to understand the principles and precepts thereof. Accordingly, the scope of the patent should not be limited to the forms of the invention herein specifically shown and described but by the advance by which the invention has promoted the art.

What is claimed is:

1. A digital servo indicator for producing an indication representing the measurement of an unknown voltage, comprising:
    digital-to-analog conversion means including means for producing a variable known voltage from a constant reference voltage using a cascading series of circuits, each circuit having
       a precision resistance element, and
       a pair of solid-state, low-resistance switching elements for selectively connecting the constant reference voltage to the output through the resistance element to produce a desired known voltage;
    means connecting the known voltage in opposition to the unknown voltage to produce an error signal from the difference therebetween;
    voltage-to-frequency conversion means for producing a series of pulses from the error signal, the series of pulses having a repetition rate which maintains a constant proportionality to the magnitude of the error signal;
    a bidirectional counter which counts the pulses and provides a binary signal for continuously controlling the digital-to-analog conversion means;
    means responsive to the polarity of the error signal for enabling the counter to be incremented by the pulses for one polarity and decremented by the pulses for the opposite polarity; and
    a microcomputer means connected to the digital-to-analog conversion means for receiving the binary signal from the counter and for converting the binary signal to data representing the measurement of the unknown voltage.

2. A digital servo indicator as defined in claim 1, wherein the microcomputer means includes means to convert the data representing the measurement of the unknown voltage to other data using multiplying factors.

3. A digital servo indicator as defined in claim 1, wherein the microcomputer means includes means to test the data representing the measurement of the unknown voltage to determine if the values of the data are within a specified range.

4. A digital servo indicator as defined in claim 1, wherein the microcomputer means includes means to subtract data representing a zero measurement from the data representing the measurement of the unknown voltage.

5. A digital servo indicator as defined in claim 1, wherein the solid-state, low-resistance element is a MOSFET.

6. A digital indicator as defined in claim 1, wherein each circuit also has a positive feedback means connected in parallel with the precision resistance element to further reduce the equivalent resistance of the switching device.

7. A digital servo indicator as defined in claim 1, comprising in addition inverter amplifying means connected to the digital-to-analog conversion means and to the unknown voltage for cancelling the net flow of measurement circuit current therebetween.

8. A digital servo indicator for producing an indication representing the measurement of an unknown voltage produced by the imbalance of the bridge comprising:

digital-to-analog conversion means for continuously producing a variable known voltage from a constant reference voltage using a cascading series of circuits each having a precision resistance element and a pair of MOSFETs for selectively connecting the constant reference voltage to the output through the resistance element to produce the desired known voltage;

means connecting the known voltage in opposition to the unknown voltage to produce an error signal from the difference therebetween;

voltage-to-frequency conversion means for producing a series of pulses from the error signal, the series of pulses having a repetition rate which maintains a constant proportionality to the magnitude of the error signal;

a bidirectional counter which counts the pulses and provides a binary signal in response thereto for continuously controlling the digital-to-analog conversion means;

means responsive to the polarity of the error signal for enabling the counter to be incremented by the pulses for one polarity and decremented by pulses for the opposite polarity;

a microcomputer means connected to the digital-to-analog conversion means for receiving the binary signal from the counter, for using the binary signal to produce a digital indication of the unknown voltage, for converting the digital indication to another parameter using multiplying factors, for testing the digital indication to determine if values are within a specified range, and for subtracting an indication of a zero reading from the digital indication of the unknown voltage; and output means for displaying the digital representation produced by the microcomputer means.

* * * * *